(12) United States Patent
Choi

(10) Patent No.: US 7,643,344 B2
(45) Date of Patent: Jan. 5, 2010

(54) VARIABLE RESISTIVE MEMORY

(75) Inventor: Byung-Gil Choi, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 259 days.

(21) Appl. No.: 11/750,487

(22) Filed: May 18, 2007

(65) Prior Publication Data
US 2008/0068875 A1 Mar. 20, 2008

(30) Foreign Application Priority Data
Sep. 19, 2006 (KR) ........................ 10-2006-0090507

(51) Int. Cl.
*G11C 16/04* (2006.01)
(52) U.S. Cl. .................. 365/185.13; 365/148; 365/158; 365/163; 365/230.03
(58) Field of Classification Search .................. 365/46, 365/100, 148, 163, 158, 171, 173, 185.13, 365/185.23, 185.25, 210.13, 230.03
See application file for complete search history.

(56) References Cited
U.S. PATENT DOCUMENTS

| | | | |
|---|---|---|---|
| 6,327,202 B1 | 12/2001 | Roohparvar | |
| 6,456,521 B1 * | 9/2002 | Hsu et al. | .................. 365/149 |
| 6,493,284 B2 * | 12/2002 | Kim | ...................... 365/230.06 |
| 6,791,859 B2 | 9/2004 | Hush | |
| 7,016,214 B2 * | 3/2006 | Kawamata et al. | ............ 365/63 |
| 2006/0023497 A1 | 2/2006 | Kawazoe et al. | |
| 2006/0059405 A1 | 3/2006 | Parkinson | |

FOREIGN PATENT DOCUMENTS
WO 03058632 7/2003

* cited by examiner

*Primary Examiner*—Son Dinh
*Assistant Examiner*—Harry W Byrne
(74) *Attorney, Agent, or Firm*—F. Chau & Associates, LLC

(57) ABSTRACT

A variable resistive memory device includes memory sectors, memory cells in each of the memory sectors, sub-wordlines including a first in signal communication with at least a first pair of the memory cells in a first sector and a second in signal communication with at least a second pair of the memory cells in a second sector, local bitlines where each is in signal communication a memory cell, a local bitline selecting signal generator in signal communication with local bitline selecting signal paths, a first local bitline selecting signal path in signal communication with a first pair of the local bitlines, and a second local bitline selecting signal path in signal communication with a second pair of the plurality of local bitlines, where a first of the first pair of local bitlines is in signal communication with a first of the first pair of the memory cells in the first sector and a second of the first pair of local bitlines is in signal communication with a second of the second pair of the memory cells in the second sector, and a first of the second pair of local bitlines is in signal communication with a second of the first pair of the memory cells in the first sector and a second of the second pair of local bitlines is in signal communication with a first of the second pair of the memory cells in the second sector.

10 Claims, 9 Drawing Sheets

FIG. 1A (BACKGROUND)
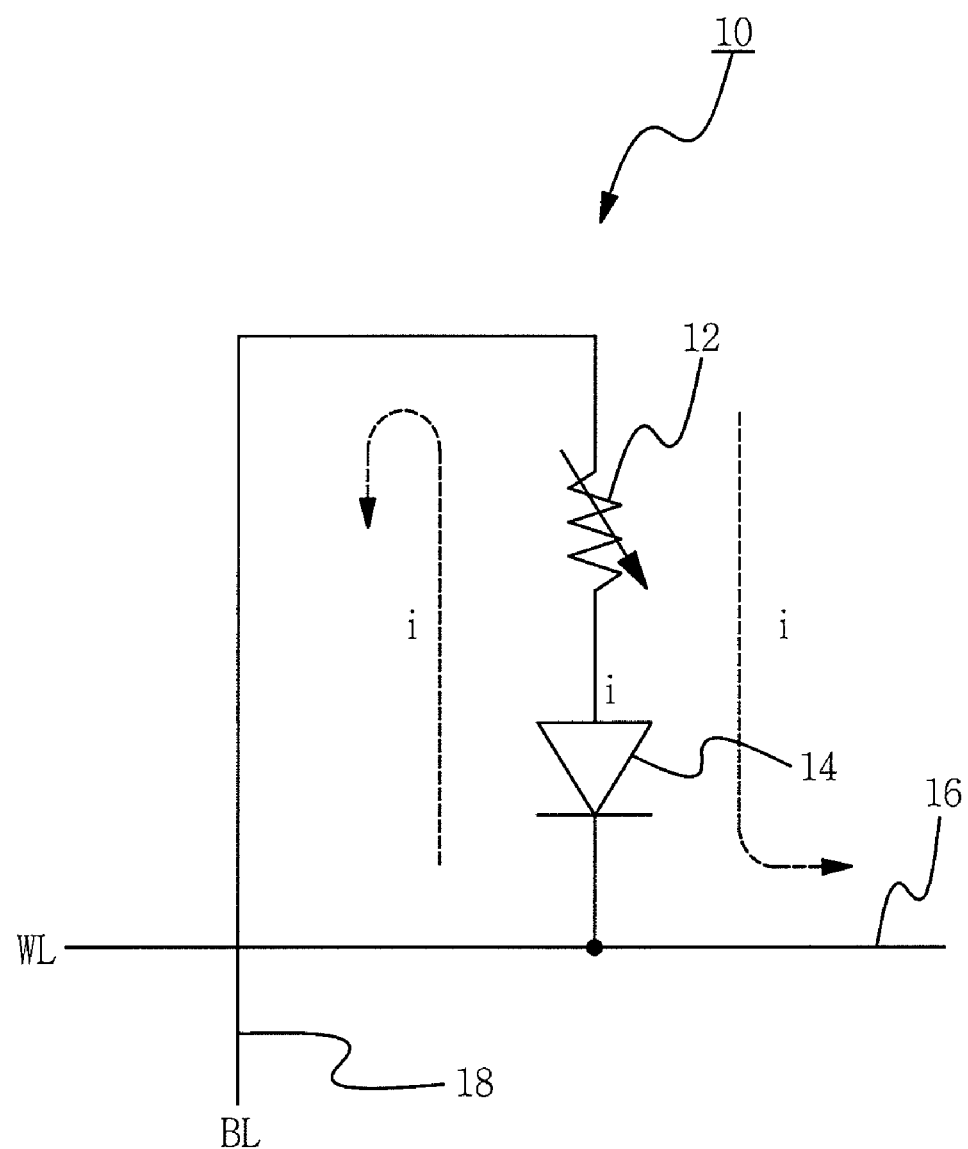

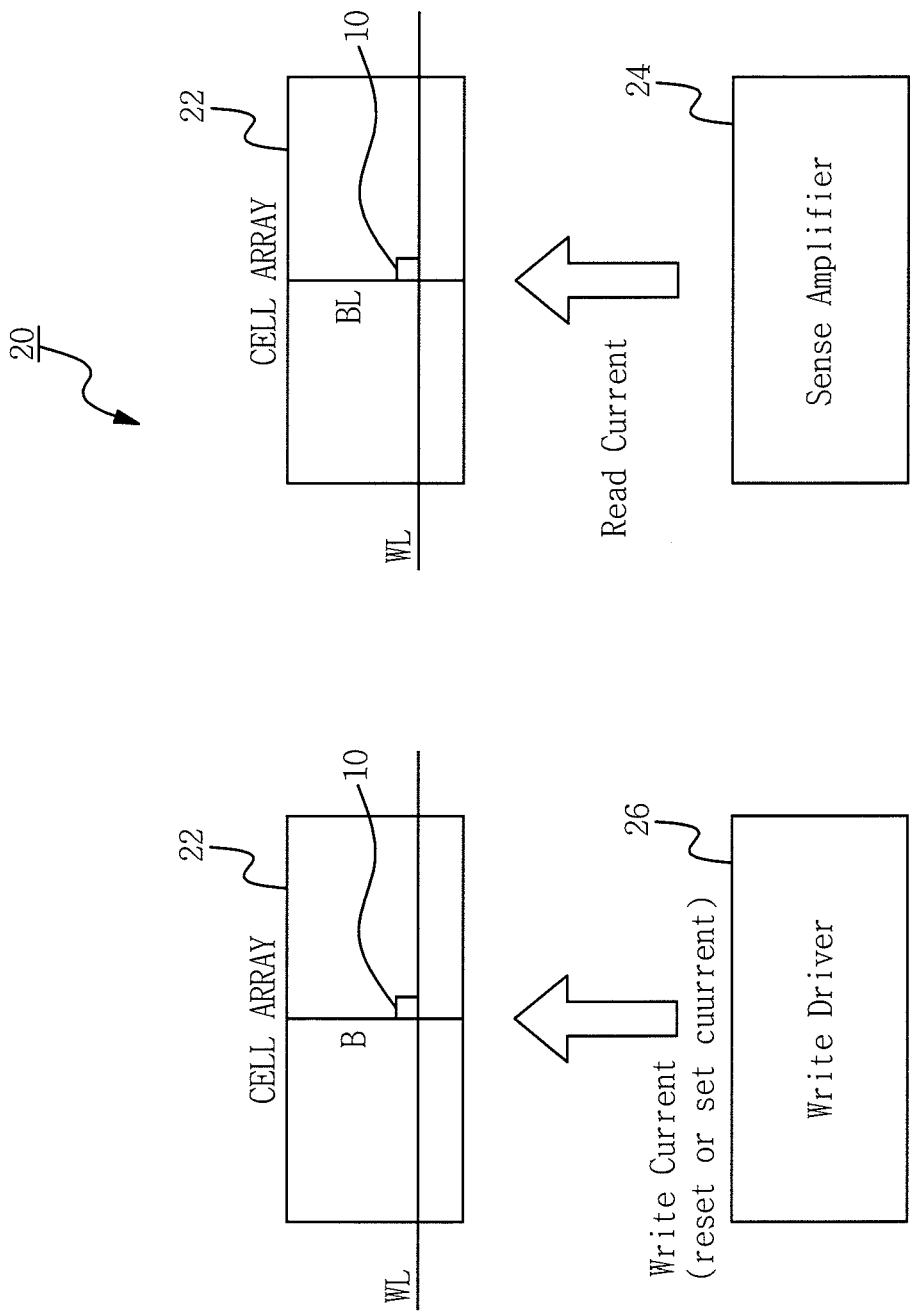
FIG. 1B (BACKGROUND)

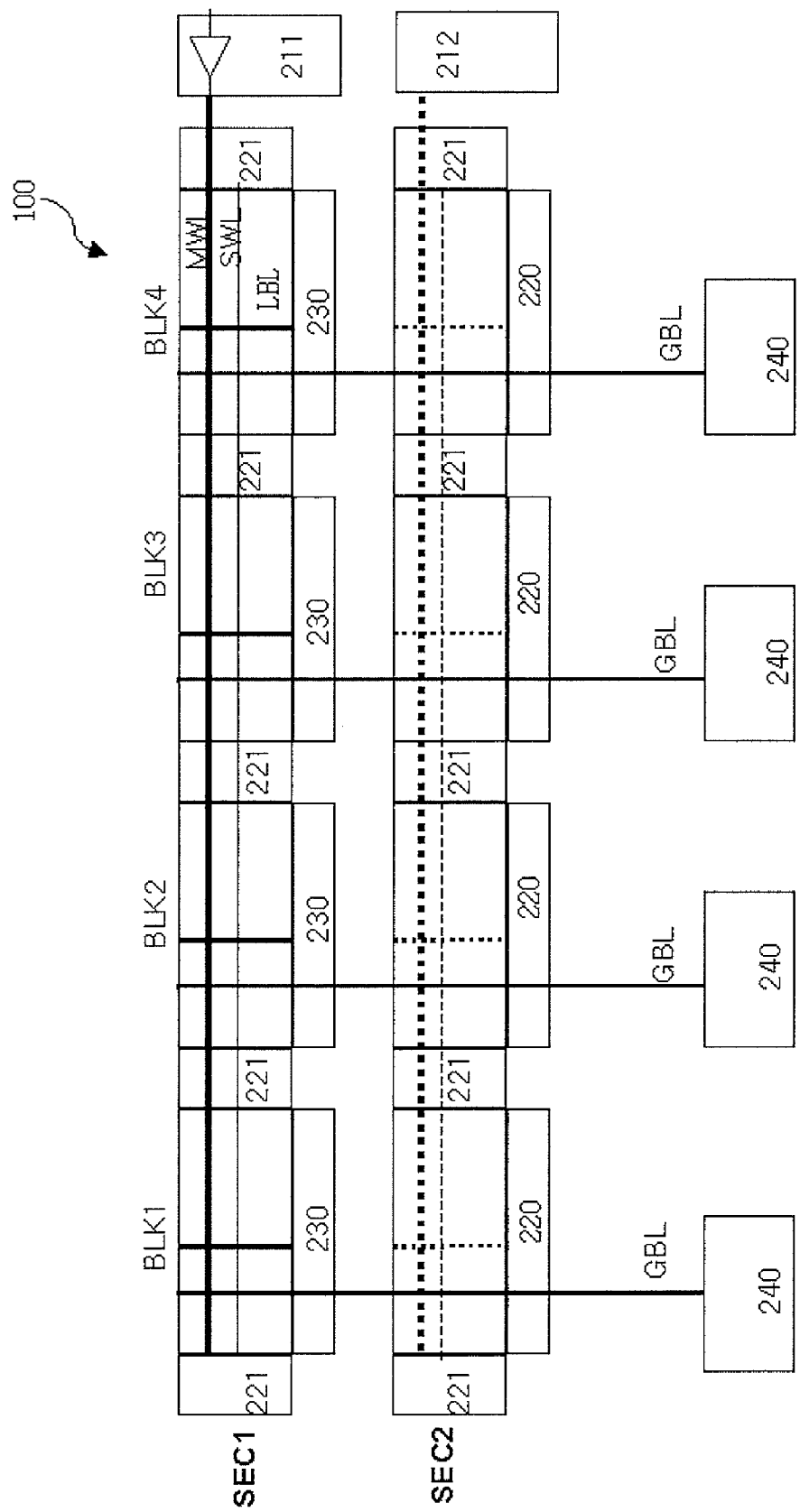
FIG. 2 (BACKGROUND)

VARIABLE RESISTIVE MEMORY

CROSS-REFERENCE TO RELATED APPLICATION

This application claims foreign priority under 35 U.S.C. § 119 to Korean Patent Application No. 2006-0090507, filed on Sep. 19, 2006, in the Korean Intellectual Property Office, the disclosure of which is incorporated by reference herein in its entirety.

BACKGROUND OF THE INVENTION

The present disclosure relates to variable resistive memory devices and operating methods. More particularly, the present disclosure relates to variable resistive memory devices having a hierarchical wordline structure.

As the demands of high density and low power consumption continue to increase in memory devices, a new generation of memory devices has recently been introduced. Criteria for the new generation of memory devices include the non-volatile characteristic for low power consumption, and easy scalability for high density. There have been several types of new generation memory devices, including Phase change Random Access Memory ("PRAM"), Resistive Random Access Memory ("RRAM"), and Magnetic Random Access Memory ("MRAM").

As shown in FIG. 1a, a unit memory cell is indicated generally by the reference numeral 10. The memory cell 10 includes a bitline ("BL") 18, a variable resistive material or part 12 connected to the BL, a switching element 14 connected to the variable resistive part, and a wordline ("WL") 16 connected to the switching element, where the switching element may be a transistor or a diode.

Depending on the variable resistive material, a memory device may be one of PRAM, RRAM or MRAM types. If the variable resistive material is defined by a lower electrode, an upper electrode, and a phase change material between the lower and upper electrodes, then the memory device is PRAM. If the variable resistive material is defined by a lower electrode, an upper electrode, and a Complex Metal Oxide ("CMO") material between the lower and upper electrodes, then the memory device is RRAM. If the variable resistive material is defined by lower and upper electrodes of ferroelectric material with an insulating material between them, the memory device is MRAM. A common characteristic of these three types of memory devices is that current flows from a bitline to a wordline or vice versa when a Write operation or a Read operation occurs. For simplicity of explanation, it may be hereinafter assumed that the variable resistive material is a phase change material, but the concepts extend to the other types of new generation memory devices as well.

Turning to FIG. 1b, a memory is indicated generally by the reference numeral 20. The memory 20 includes at least one cell array 22 having a plurality of memory cells 10 of FIG. 1a, a sense amplifier 24 connected to the cell 10 for providing a read current, and a write driver 26 connected to the cell 10 for providing a write current, which may be either a reset or a set current.

During a Write operation the write current flows from write driver 26 towards the WL 16. If the write data is "1", a reset current flows from the BL 18 of FIG. 1a to the WL 16 of FIG. 1a through the unit memory cell 10 if the write data is "0", a set current flows from the BL to the WL through the unit memory cell 10. The reset current is larger than the set current.

During a Read operation, the read current flows from the sense amplifier 24 towards the WL. The sense amplifier detects the read current and amplifies the read current. The amount of current is dependent on a voltage difference between the BL and the WL.

Turning now to FIG. 2, a memory device is indicated generally by the reference numeral 100. The memory device 100 includes first and second memory sectors SEC1 and SEC2, memory blocks BLK1, BLK2, BLK3 and BLK4, a first main wordline driver 211 connected to a main wordline ("MWL") in the first sector SEC1, and a second main wordline driver 212 connected to a MWL in the second sector SEC2. Each block of each sector includes a sub-wordline driver 221 connected to the sub-wordline ("SWL") for the sector. Each memory block of the first sector includes a local bitline selection part 230, and each memory block of the second sector includes a local bitline selection part 220. A plurality of write driver and sense amplifier units 240 connect to a corresponding number of global bitlines ("GBL"), which connect to each block.

For an exemplary Write operation of the memory device 100, the dotted lines of FIG. 2 indicate non-activated lines and the solid lines indicate the activated lines. During this Write operation, one MWL in one memory sector (here, SEC1) is activated by a main wordline driver (here, 211). Each sub-wordline driver 221 of the memory blocks in SEC1 drives the SWL of the sector to reach VSS. The local bitline selecting parts 230 in SEC1 connect each local bitline ("LBL") in each memory block to a corresponding global bitline ("GBL") for that column or bit position. Thus, a voltage of the GBL delivered by the write driver is transferred to the LBL in each memory block in SEC1. Therefore, a write current due to the voltage difference between LBL and SWL flows from each LBL to the SWL through the variable resistive material in each memory cell. Due to the amount of the write current, the variable resistive material exhibits either high resistance or low resistance.

Unfortunately, since the write current can flow to one SWL through all of the memory cells connected to the one SWL, a voltage of the SWL rises. Due to this rise of the voltage of the SWL, the voltage difference between a bitline and the SWL is reduced and a desirable write current from a given LBL to the SWL may not flow. This can cause a Write operation to fail. In addition, a Read operation can fail for similar reasons.

SUMMARY OF THE INVENTION

These and other issues are addressed by a variable resistive memory device and related methods. Exemplary embodiments are provided.

An exemplary variable resistive memory device includes memory sectors, memory cells in each of the memory sectors, sub-wordlines including a first in signal communication with at least a first pair of the memory cells in a first sector and a second in signal communication with at least a second pair of the memory cells in a second sector, local bitlines where each is in signal communication a memory cell, a local bitline selecting signal generator in signal communication with local bitline selecting signal paths, a first local bitline selecting signal path in signal communication with a first pair of the local bitlines, and a second local bitline selecting signal path in signal communication with a second pair of the plurality of local bitlines, where a first of the first pair of local bitlines is in signal communication with a first of the first pair of the memory cells in the first sector and a second of the first pair of local bitlines is in signal communication with a second of the second pair of the memory cells in the second sector, and a first of the second pair of local bitlines is in signal communication with a second of the first pair of the memory cells in the first sector and a second of the second pair of local bitlines is in signal communication with a first of the second pair of the memory cells in the second sector.

An exemplary method for activating a plurality of memory cells in a bank of a variable resistive memory device includes activating a plurality of memory sectors for one of a Write operation or a Read operation, and activating at least one memory cell in each of the plurality of activated memory sectors, wherein an activated memory cell in one of the plurality of activated memory sectors shares a global bitline with a non-activated memory cell in another of the plurality of activated memory sectors.

An exemplary method for controlling the current flow through a variable resistive memory device includes maintaining substantially stable sub-wordline voltages by distributing memory cells to be activated at one time among a plurality of sub-wordlines, and passing a read or a write current through the variable resistive m memory device from a local bitline to the substantially stable sub-wordline.

The present disclosure will be further understood from the following description of exemplary embodiments, which is to be read in connection with the accompanying drawings.

BRIEF DESCRIPTION OF THE DRAWINGS

The present disclosure provides a variable resistive memory device and related method in accordance with the following exemplary figures, in which;

FIG. 1a shows a schematic circuit diagram for a unit memory cell, which is provided as background material;

FIG. 1b shows a schematic block diagram for a memory in accordance with FIG. 1;

FIG. 2 shows a schematic diagram for a memory device, which is provided as background material;

DETAILED DESCRIPTION OF PREFERRED EMBODIMENTS

A variable resistive memory device and related method are provided. Embodiments of the present disclosure reduce an undesirable rise of wordline voltage due to a write current and/or a read current. Related methods are provided for enabling wordlines and for selecting bitlines.

Variable resistive memory devices may include Phase change Random Access Memory ("PRAM"), Resistive Random Access Memory ("RRAM"), and Magnetic Random Access Memory ("MRAM"). A common characteristic of these variable resistive memory devices is that current flows between a bitline and a wordline when a write or Read operation occurs. While exemplary embodiments may be described with respect to PRAM devices in accordance with a best mode, the present disclosure is similarly applicable to other types of variable resistive memory devices.

Figure 3:
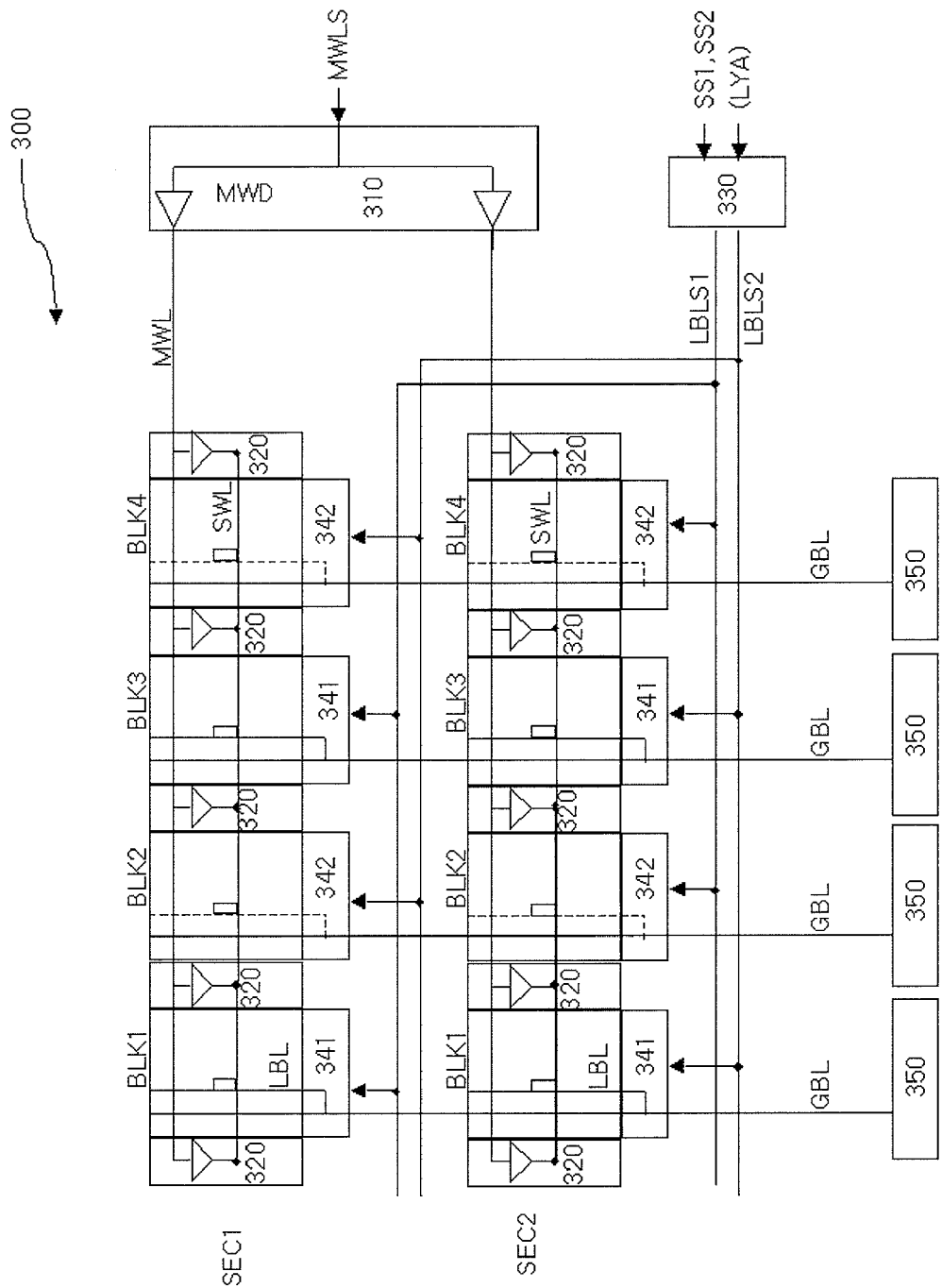
FIG. 3 shows a schematic diagram for a memory device in accordance with an exemplary embodiment of the present disclosure.

As shown in FIG. 3, a memory device according to an exemplary embodiment of the present disclosure is indicated generally by the reference numeral 300. The memory device 300 includes memory sectors SEC1 and SEC2, memory blocks BLK1 through BLK4, a plurality of memory cells each defined by the intersection of a horizontal sector with a vertical block, a main wordline driver 310 having an output to a main wordline ("MWL") for each sector, a sub-wordline driver 320 disposed at each of the plurality of memory cells, the sub-wordline drivers each connected to a sub-wordline ("SWL") for the sector, local bitline selecting parts 341 and 342 each connected to a local bitline ("LBL"), where each SWL to LBL intersection has a part 341 or a part 342, a local bitline selecting signal generating part 330 having a first selection signal path LBLS1 connected to the first selecting parts 341 of the first sector SEC1 and connected to the second selecting parts 342 of the second sector SEC2, and having a second selection signal path LBLS2connected to the second selecting parts 342 of the first sector SEC1 and connected to the first selecting parts 341 of the second sector SEC2, a first plurality of write driver and sense amplifiers 350 each connected through a global bitline ("GBL") to the selecting parts 341 of each odd numbered block, respectively, and a second plurality of write driver and sense amplifiers 350 each connected through a GBL to the selecting parts 342 of each even numbered block, respectively.

The LBLS1 is connected to alternating blocks in alternating sectors, while the LBLS2 is connected to the other alternating blocks in alternating sectors. Thus, a checkerboard pattern of memory blocks is activated in this exemplary embodiment, while other alternating patterns may be used in alternate embodiments.

For simplicity of explanation, one SWL and one LBL are shown in each memory block, but a plurality of sub-wordlines and a plurality of local bitlines may be in each memory block in alternate embodiments. In addition, each memory block may have a plurality of memory cells at each intersection area between a SWL and a LBL in alternate embodiments.

Here, each memory sector includes four memory blocks BLK1 through BLK4. A MWL connects through the blocks of a memory sector. The main wordline driver activates one MWL in each memory sector in response to a main wordline selection signal MWLS.

The sub-wordline driver is located among the memory blocks and connected to the MWL. The sub-wordline driver drives the SWL to get ground voltage when the MWL is activated. For simplicity of explanation, one SWL is shown connected to each MWL in FIG. 3, but a plurality of SWLs may be connected to one MWL in alternate embodiments. The local bitline selecting signal-generating part 330 generates first and second local bitline selecting signal LBLS1 and LBLS2 in response to memory sector information, including memory sector address decoding signals SS1 and SS2. If a global bitline is assigned to have a plurality of local bitlines the local bitline selecting signal-generating part may also use an optional local bitline address selecting information signal LYA to generate the local bitline selecting signals LBLS1 and LBLS2.

The local bitline selecting parts include the first local bitline selecting parts 341 assigned to odd memory blocks BLK1 and BLK3 in odd memory sectors such as SEC1 and assigned to even memory blocks BLK2 and BLK4 in even memory sectors such as SEC2, and the second local bitline selecting parts 342 assigned to even memory blocks BLK2 and BLK4 in odd memory sectors such as SEC1 and assigned to odd memory blocks BLK1 and BLKS in even memory sectors such as SEC2. Each local bitline selecting part connects a local bitline LBL to a corresponding GBL in response to a corresponding one of the local bitline selecting signal LBLS1 or LBLS2.

The first local bitline selecting parts of the odd memory blocks in SEC1 and the second local bitline selecting parts of the even memory blocks in SEC2 each connects the LBL in each respective memory block to a corresponding GBL in response to LBLS1 signal. The second local bitline selecting parts of the even memory blocks in SEC1 and the first local bitline selecting parts of the odd memory block in SEC2 each connects the LBL in each respective memory block to a corresponding GBL in response to LBLS2 signal. Each write driver and sense amplifier unit 350 supplies a write voltage to a corresponding GBL, and senses and amplifies read current, respectively In the exemplary embodiment memory device 300, because only half of the memory blocks comprising each memory sector are activated when a Write operation or a Read operation occurs, the write current or read current flow to one sub-wordline can be decreased by half compared with the memory device 100 of FIG. 2 or conventional memory devices. Thus, the memory device 300 makes it possible to substantially prevent a rising sub-wordline voltage.

Figure 4:
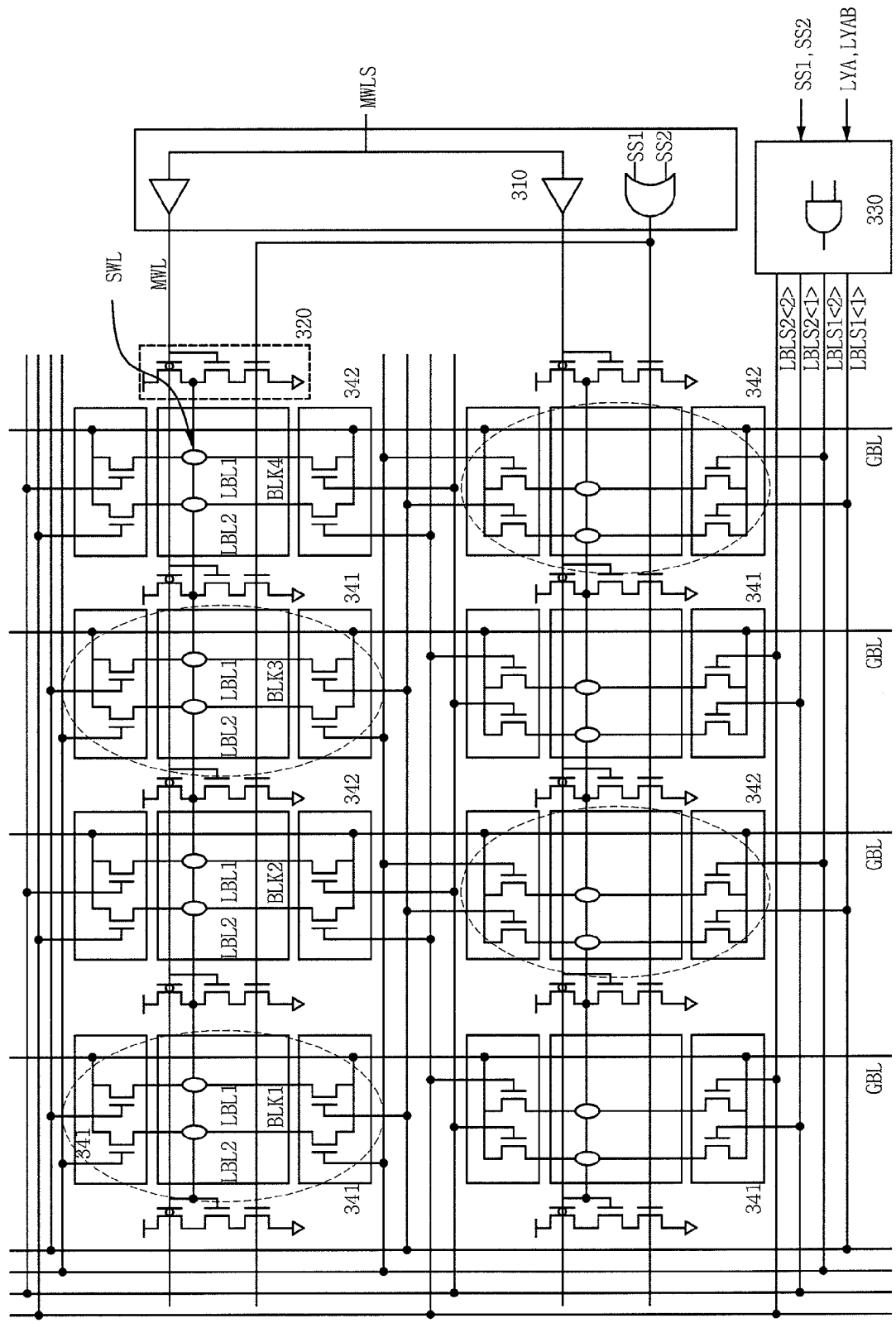
FIG. 4 shows a schematic circuit diagram for a memory device in accordance with FIG. 3.

Turning to FIG. 4, a detailed circuit for a memory device in accordance with FIG. 3 is indicated generally by the reference numeral 400. The circuit 400 includes two local bitlines LBL1 and LBL2, which are assigned to one GBL in each memory block, where the local bitline selecting parts are located at upper and lower portions of each memory block.

A sub-wordline driver 320 connects the SWL to VSS in response to a MWL signal and the memory sector information SS0 and SS0B. In embodiments where pluralities of SWLs are assigned to one MWL, the sub-wordline driver may have a sub-wordline selecting signal with the memory sector information.

A local bitline selecting signal generating part 330 inputs SS1 and SS2 and local bitline selecting information LYA and LYAB, and activates one of the local bitline selecting signal LBLS1<1:2> or LBLS2<1:2>. Local bitline selecting parts 341 and 342 include NMOS transistors, and are located at upper and lower portions of each memory block, respectively. Each local bitline selecting part connects one of two local bitlines to corresponding GBL in response to a corresponding one of LBLS1<1:2> or LBLS2<1:2>. In addition, because the local bitline selecting parts are located at upper and lower portions of each memory block, speed loss due to the load of local bitlines can be prevented.

Table 1, shown below, indicates the activated local bitline selection signal and resulting connections of LBLs to GBLs in response to the memory sector information and the local bitline selecting information.

TABLE 1

| | SS1 | SS2 | LYA | LYAB | Connected local bitline to global bitline |
|---|---|---|---|---|---|
| LBLS1<1> "H" | H | L | H | L | LBL1 in BLK1 & BLK3 in SEC1, LBL1 in BLK2 & BLK4 in SEC2 |
| LBLS1<2> "H" | H | L | L | H | LBL2 in BLK1 & BLK3 in SEC1, |

TABLE 1-continued

| | SS1 | SS2 | LYA | LYAB | Connected local bitline to global bitline |
|---|---|---|---|---|---|
| | | | | | LBL2 in BLK2 & BLK4 in SEC2 |
| LBLS2<1> "H" | L | H | H | L | LBL1 in BLK2 & BLK4 in SEC1, LBL1 in BLK1 & BLK3 in SEC2 |
| LBLS2<2> "H" | L | H | L | H | LBL2 in BLK2 & BLK4 in SEC1, LBL2 in BLK1 & BLK3 in SEC2 |

In operation of a memory device 300 or 400 with reference to Table 1; a Write operation according to the SS1 column and LBLS1<1> "H" row of the table is explained. First, the main wordline driver activates MWL in SEC1 and MWL in SEC2, at the same time, in response to MWLS. The sub-wordline driver connects SWL in each memory block of each memory sector to VSS in response to the activated MWL and memory sector information SS1 and SS2.

The write driver supplies write voltage to the corresponding GBL. The local bitline selection signal generator makes only LBLS1<1> high ("H") in response to SS1 "H" and LYA "H". The first local bitline selecting parts 341 in odd memory blocks BLK1 and BLK3 of SEC1 connect LBL1 to the corresponding GBL in response to LBLS1<1> high. Similarly, the second local bitline selecting parts 342 in even memory blocks BLK2 and BLK4 in SEC2 connect LBL1 to the corresponding GBL in response to LBLS1<1> high. Thus, the write voltage of GBL is transferred to LBL1.

Due to a voltage difference between the write voltage transferred to LBL1 and VSS of SWL, a write current flows from LBL1 to SWL through the variable resistive material and the diode or switching unit of the unit memory cell. Thus a resistance of the variable resistive material has either high resistance or low resistance according to the magnitude of the write current.

In the exemplary embodiment memory devices 300 and 400 because only half of the memory blocks comprising each memory sector operate when a Write operation occurs the write current to one sub-wordline can be decreased by half compared to a conventional memory device. A Read operation benefits similarly to a Write operation. Because only half of the memory blocks comprising a memory sector are activated when a Read operation occurs read current to one sub-wordline can be decreased by half of that of a conventional memory device. Thus, the memory devices 300 and 400 perform secure Read and Write operations by suppressing an undesirable rise of the sub-wordline voltage.

Figure 5:
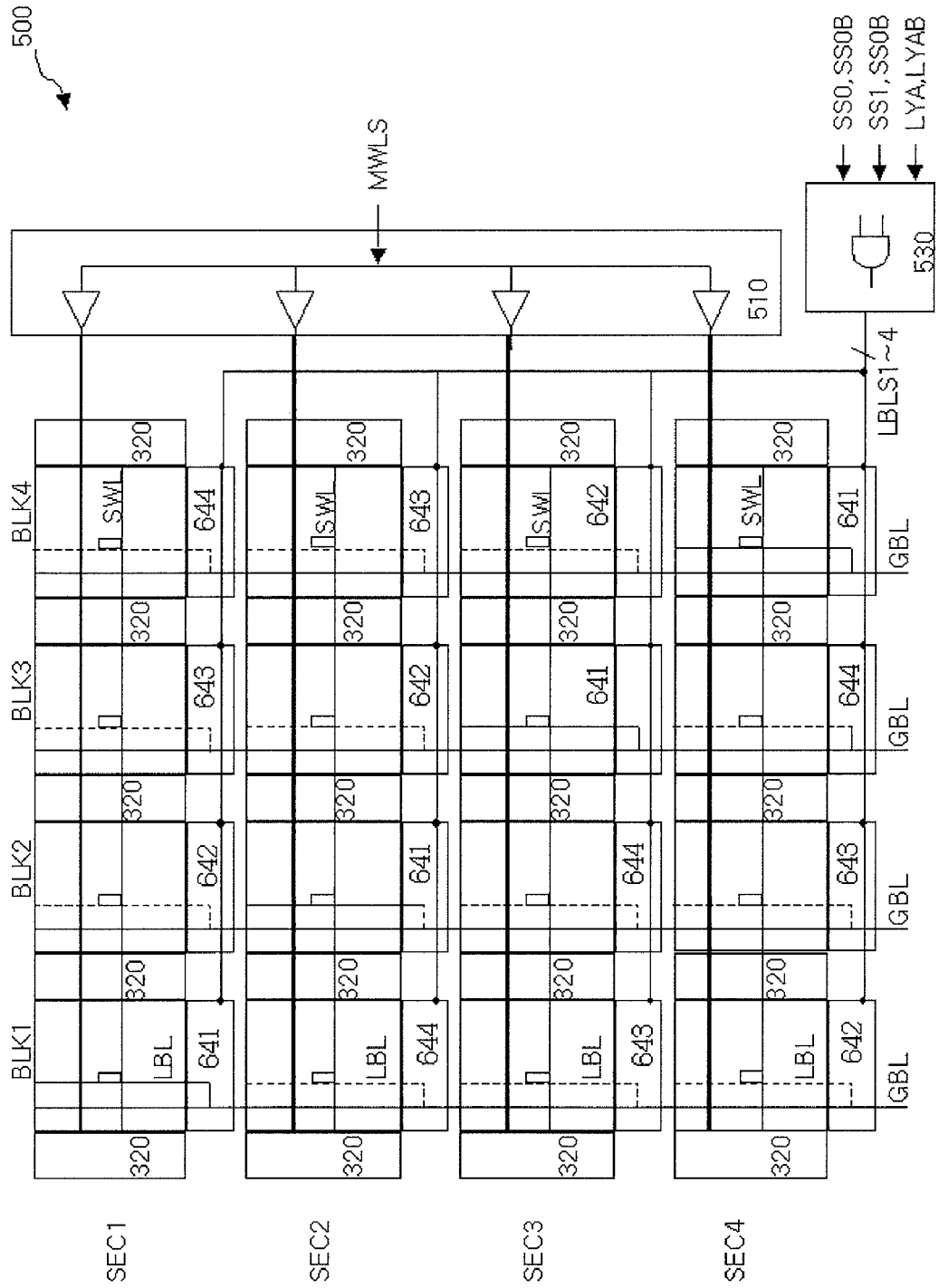
FIG. 5 shows a schematic circuit diagram for a memory device in accordance with an exemplary embodiment of the present disclosure.

Turning now to FIG. 5, a memory device according to another exemplary embodiment of the present disclosure is indicated generally by the reference numeral 500. The memory device 500 is similar to the memory device 300 of FIG. 3, except that each MWL in SEC1, SEC2, SEC3, and SEC4 is connected to a main wordline driver 510 and each MWL is activated together, and the local bitline selection signal generator 530 uses additional memory sector information.

Here, the main wordline driver activates each MWL in SEC1, SEC2, SEC3, and SEC4 together in response to MWLS. The local bitline selection signal generating part generates local bitline selection signals LBBS1 through LBBS4 in response to memory sector information signals SS1, SS2, SS3 and SS4. In cases where a plurality of local bitlines are assigned to one global bitline, the local bitline selection signal generator may use an optional local bitline selecting information signal LYA and LYAB along with the memory sector information signals SS1, SS2, SS3 and SS4.

The local bitline selecting parts 641, 642, 643 and 644 are assigned to corresponding memory blocks, and each connects a LBL to a corresponding GBL in response to the corresponding one of LBBS1 through LBBS4. Table 2, shown below, indicates which memory block is activated in each memory sector in response to the memory sector information signals SS1, SS2, SS3 and SS4.

TABLE 2

|  | SS1 | SS2 | SS3 | SS4 | SEC1 | SEC2 | SEC3 | SEC4 |
|---|---|---|---|---|---|---|---|---|
| LBBS1 "H" | H | L | L | L | BLK1 | BLK2 | BLK3 | BLK4 |
| LBBS2 "H" | L | H | L | L | BLK2 | BLK3 | BLK4 | BLK1 |
| LBBS3 "H" | L | L | H | L | BLK3 | BLK4 | BLK1 | BLK2 |
| LBBS4 "H" | L | L | L | H | BLK4 | BLK1 | BLK2 | BLK3 |

In the memory device 500, because only one quarter of the memory blocks in each memory sector operate when a write or Read operation occurs, write current and read current to one sub-wordline can be decreased by about 75% compared to a conventional memory device.

Figure 6:
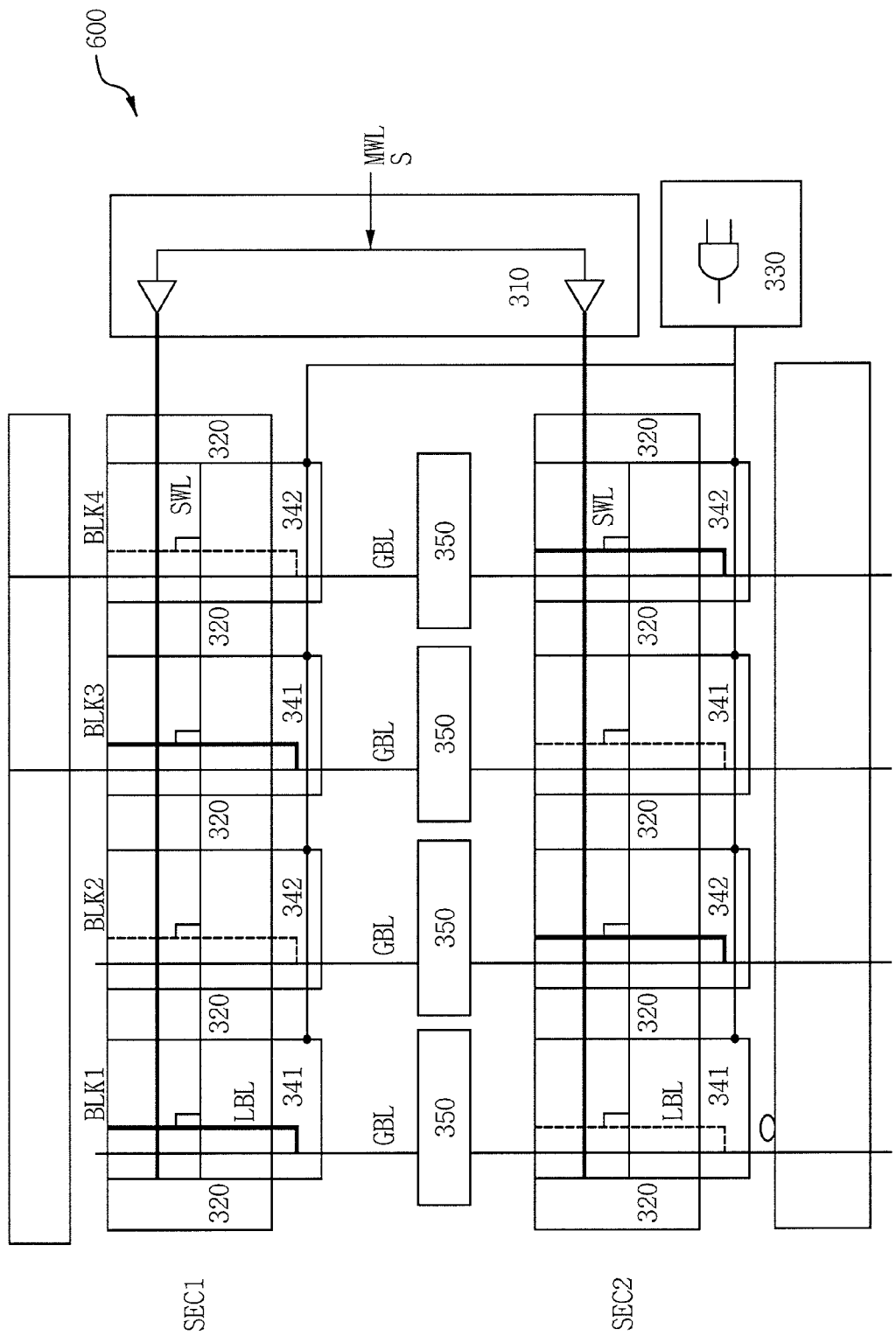
FIG. 6 shows a schematic circuit diagram for a memory device in accordance with an exemplary embodiment of the present disclosure.
Figure 7:
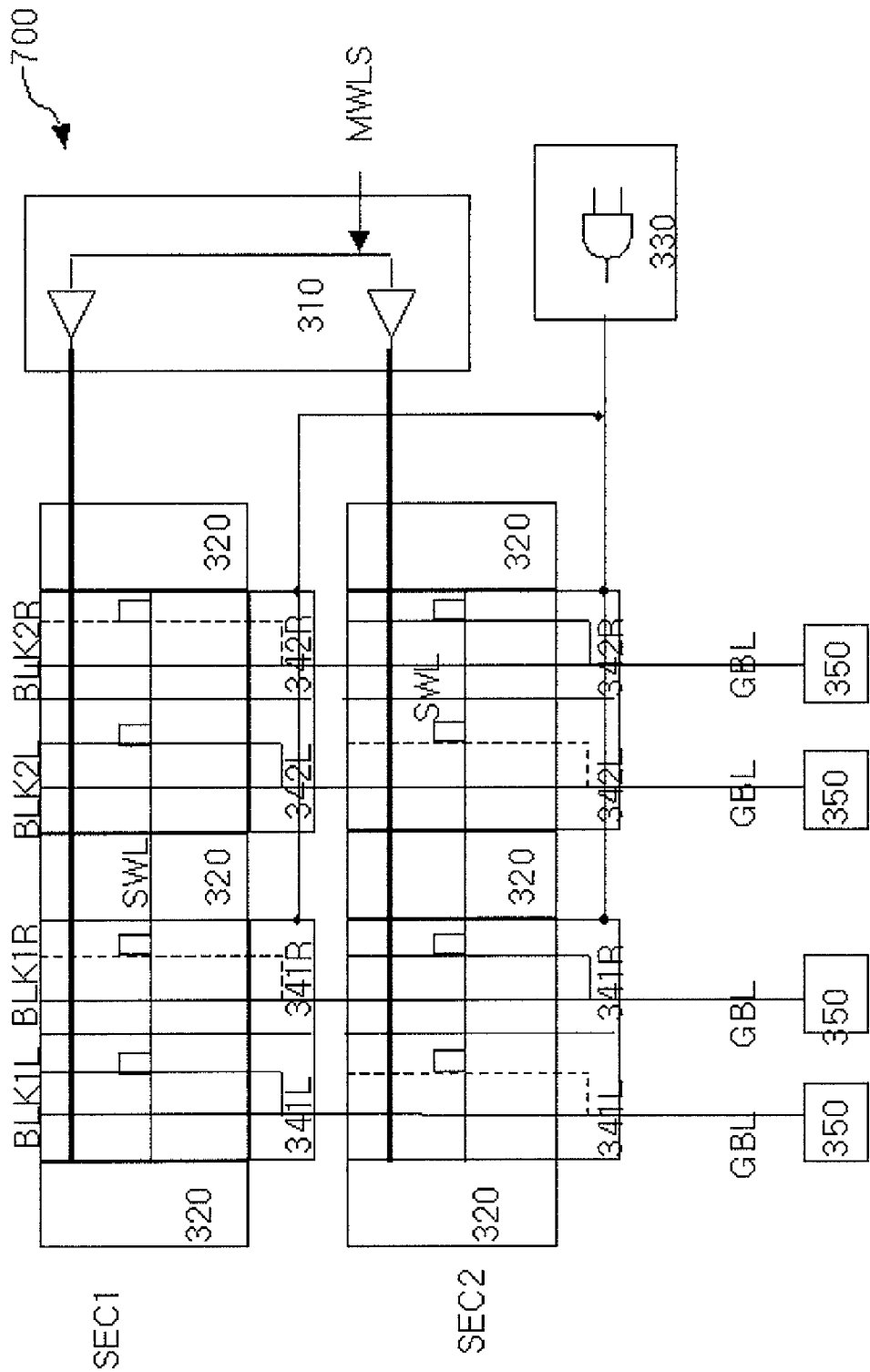
FIG. 7 shows a schematic circuit diagram for a memory device in accordance with an exemplary embodiment of the present disclosure.

Turning now to FIG. 6, a memory device according to another exemplary embodiment of the present disclosure is indicated generally by the reference numeral 600. The memory device 600 is similar to the memory device 300 of FIG. 3, except that a write driver and sense amplifier unit 350 is located at the center of the memory sectors. Write operations and Read operations of the memory device 600 are substantially the same as for the memory device 300 of FIG. 3. In addition, because the distance from each memory sector to the write driver and sense amplifier unit is substantially the same, the signal propagation delay is the same so it takes the same amount of time for writing or reading different memory sectors. In alternate embodiments, the write driver and sense amplifier located in the middle of the sectors may be extended to more than two sectors by adding more write driver and sense amplifier units between and/or equidistant to the additional sectors. Turning now to FIG. 7, a memory device according to another exemplary embodiment of the present disclosure is indicated generally by the reference numeral 700. The memory device 700 includes memory sectors SEC1 and SEC2, each of which includes two memory blocks BLK1 and BLK2. Each memory block includes two sub memory blocks, BLK1L and BLK1R for BLK1, BLK2L and BLK2R for BLK2. Each sub memory block has a global bitline and local bitline selecting part 341L, 341R, 342L and 342R, respectively. Thus, the memory device 700 has a memory block size that is the same physical size as the memory device 300 of FIG. 3, but the memory device 700 has two memory cells so the SWL is shorter.

In operation of the memory device 700, when a Write operation or a Read operation occurs, only a left sub memory block or only a right sub memory block in each memory block in each memory sector operates. Thus, as the length of each sub-wordline is shorter, and write and read currents to each sub-wordline is decreased, an operating speed of the memory device 700 is increased in addition to the memory device 700 having secure write and Read operations.

Figure 8:
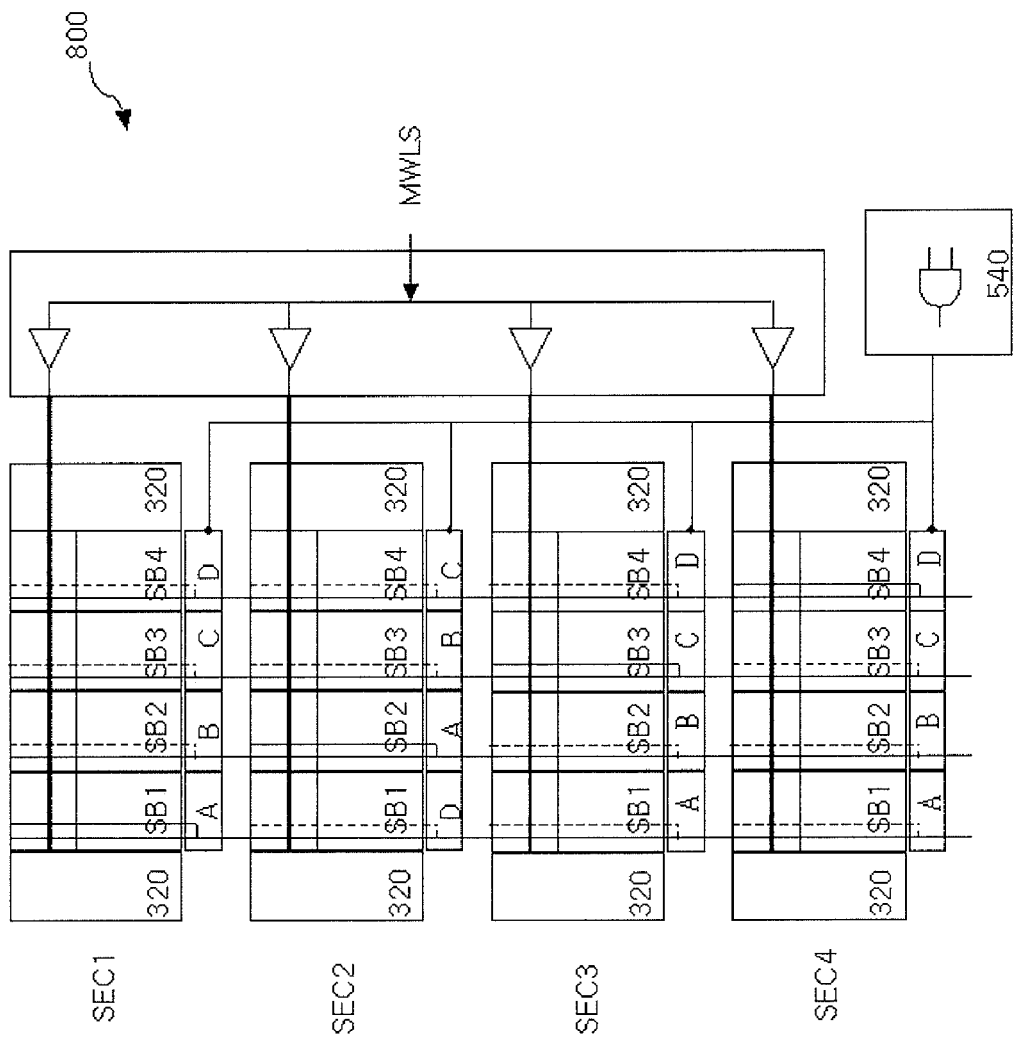
FIG. 8 shows a schematic circuit diagram for a memory device in accordance with an exemplary embodiment of the present disclosure.

Turning now to FIG. 8, a memory device according to another exemplary embodiment of the present disclosure is indicated generally by the reference numeral 800. The memory device 800 includes memory sectors SEC1 through SEC4, where each memory sector includes one memory block. That is, the memory sector size is the same as that of the memory block. Each memory block includes four sub memory blocks SB1, SB2, SB3 and SB4. Each sub memory block has a global bitline and local bitline selecting part A, B, C or D, respectively.

In operation of the memory device 800, when a Write operation or a Read operation occurs, only one sub memory block in each memory sector operates. Thus, write current and read current to one sub-wordline is decreased, so the memory device 800 has secure Write operations and Read operations.

Although illustrative embodiments have been described herein with reference to the accompanying drawings, it is to be understood that the present disclosure is not limited to those precise embodiments, and that various other changes and modifications may be effected therein by those of ordinary skill in the pertinent art without departing from the scope or spirit of the present disclosure. All such changes and modifications are intended to be included within the scope of the present disclosure as set forth in the appended claims.

The invention claimed is:

1. A variable resistive memory device, comprising:
   a plurality of memory sectors;
   a plurality of memory cells in each of the plurality of memory sectors;
   a plurality of sub-wordlines, a first in signal communication with at least a first pair of the memory cells in a first sector and a second in signal communication with at least a second pair of the memory cells in a second sector;
   a plurality of local bitlines, each in signal communication with at least one of the plurality of memory cells;
   a local bitline selecting signal generator in signal communication with a plurality of local bitline selecting signal paths;
   a first local bitline selecting signal path in signal communication with at least a first pair of the plurality of local bitlines; and
   a second local bitline selecting signal path in signal communication with at least a second pair of the plurality of local bitlines;
   wherein a first of the first pair of local bitlines is in signal communication with a first of the first pair of the memory cells in the first sector and a second of the first pair of local bitlines is in signal communication with a second of the second pair of the memory cells in the second sector, and a first of the second pair of local bitlines is in signal communication with a second of the first pair of the memory cells in the first sector and a second of the second pair of local bitlines is in signal communication with a first of the second pair of the memory cells in the second sector.

2. A device as defined in claim 1, further comprising:
a first memory block disposed in a first one of the plurality of memory sectors;
a first global bitline in signal communication with a first local bitline of the first memory block;
a first variable resistor in signal communication with the first local bitline;
a first switching element in signal communication with the first variable resistor;
a first sub-wordline in signal communication with a plurality of switching elements in the first sector;
a first sub-wordline driver in signal communication with the first sub-wordline;
a first main wordline in signal communication with the first sub-wordline driver; and
a first main wordline driver in signal communication with the first main wordline;
wherein the local bitline selecting signal generator is in signal communication with the first local bitline of the first memory block in the first memory sector.

3. A device as defined in claim 2, further comprising:
a second memory block disposed in a second one of the plurality of memory sectors;
a second global bitline in signal communication with a local bitline of the second memory block;
a second variable resistor in signal communication with the local bitline of the second memory block;
a second switching element in signal communication with the second variable resistor;
a second sub-wordline in signal communication with a plurality of switching elements in the second sector;
a second sub-wordline driver in signal communication with the second sub-wordline; and
a second main wordline in signal communication with the second sub-wordline driver;
wherein the local bitline selecting signal generator is in signal communication with the local bitline of the second memory block in the second memory sector.

4. A device as defined in claim 2 wherein the switching element comprises a diode or a transistor.

5. A device as defined in claim 2 wherein the variable resistor comprises a phase-change material, a complex metal oxide material, or a magnetic material.

6. A device as defined in claim 1 wherein the local bitline selector is in switchable signal communication with either odd-numbered memory blocks of an odd-numbered memory sector and even-numbered memory blocks of an even-numbered memory sector, or with even-numbered memory blocks of the odd-numbered memory sector and odd-numbered memory blocks of the even-numbered memory sector.

7. A device as defined in claim 2, further comprising at least one write driver and sense amplifier in signal communication with the at least one global bitline.

8. A device as defined in claim 7 wherein the at least one write driver and sense amplifier is disposed substantially equidistant between each of a pair of the plurality of memory sectors.

9. A device as defined in claim 1 wherein the local bitline selecting signal generator is in switchable signal communication with a different-numbered memory block of each of the plurality of memory sectors.

10. A device as defined in claim 2, further comprising a plurality of memory sub-blocks in the first memory block, the plurality of memory sub-blocks sharing a continuous sub-wordline without interposing sub-wordline drivers.

* * * * *